United States Patent [19]

Grodinsky

[11] 3,778,551

[45] Dec. 11, 1973

[54] AIR COOLED AUDIO AMPLIFIER ASSEMBLY

[75] Inventor: Robert M. Grodinsky, Skokie, Ill.

[73] Assignee: Chicago Musical Instrument Co., Lincolnwood, Ill.

[22] Filed: Jan. 17, 1969

[21] Appl. No.: 791,921

[52] U.S. Cl. .................. 179/1 E, 325/352, 317/100

[51] Int. Cl. .................. H04m 1/02

[58] Field of Search .................. 179/1 E; 325/352, 325/353; 317/100

[56] References Cited

UNITED STATES PATENTS

| | | | |
|---|---|---|---|
| 1,807,386 | 5/1931 | Clarke | 325/352 |
| 2,031,997 | 2/1936 | Andrews | 325/353 |
| 2,510,103 | 6/1950 | Griffin | 325/353 |
| 2,630,526 | 3/1953 | Zelov | 325/352 |
| 2,934,639 | 4/1960 | Salisbury | 325/352 |
| 3,462,553 | 8/1969 | Spranger | 179/1 A |
| 3,514,539 | 5/1970 | Jespersen | 179/1 E |

*Primary Examiner*—William C. Cooper
*Attorney*—Hill, Sherman, Meroni, Gross and Simpson

[57] ABSTRACT

An audio amplifier assembly employs transistors which are subject to substantial heating, and which are mounted on heat sinks situated on the cabinet of the device, there being air passages leading from the speaker cavity within the cabinet directly to such transistors so that the speaker cone serves as a pump for cooling air that passes across such transistors.

10 Claims, 3 Drawing Figures

PATENTED DEC 11 1973

3,778,551

INVENTOR.

ROBERT M. GRODINSKY

BY Hill, Sherman, Meroni, Gross & Simpson ATTORNEYS

AIR COOLED AUDIO AMPLIFIER ASSEMBLY

BACKGROUND OF THE INVENTION

1. Field of the Invention

This invention relates to an audio amplifier assembly, and more specifically to a construction wherein the speaker drives cooling air across a power transistor to limit its temperature rise.

2. Prior Art

Heretofore, for a given size of power transistor, it has been necessary to so select the various amplifier parameters that the transistor will not be subjected to excessive heating. For a given transistor capacity, the ultimate output power of an amplifier has thus been limited to a predetermined level, dependent upon the properties of the transistor used. In order to raise the power rating of the amplifier, where the same is of the transistor type, it has therefore been necessary to use larger more expensive transistors having higher rating.

SUMMARY OF THE INVENTION

The audio amplifier of this invention includes means operated by driven movement of the speaker for forcibly cooling its transistors that are subject to heating. Preferably, the cooling means is an air passage with the speaker cone serving as an air pump. Further, it is preferable to employ a heat sink which is likewise cooled by such speaker-driven air movement.

Accordingly, it is an object of the present invention to provide an audio amplifier assembly having increased power output capacity.

A further object of the present invention is to provide means by which the amplifier assembly can of itself cool those amplifier components that are most critically subjected to heating.

Another object of the present invention is to provide a construction for an audio amplifier assembly whereby the effective power rating of its power transistors is increased.

Many other advantages, features and additional objects of the present invention will become manifest to those versed in the art upon making reference to the detailed description and the accompanying sheet of drawings in which a preferred structural embodiment incorporating the principles of the present invention is shown by way of illustrative example.

ON THE DRAWING

Figure 1:
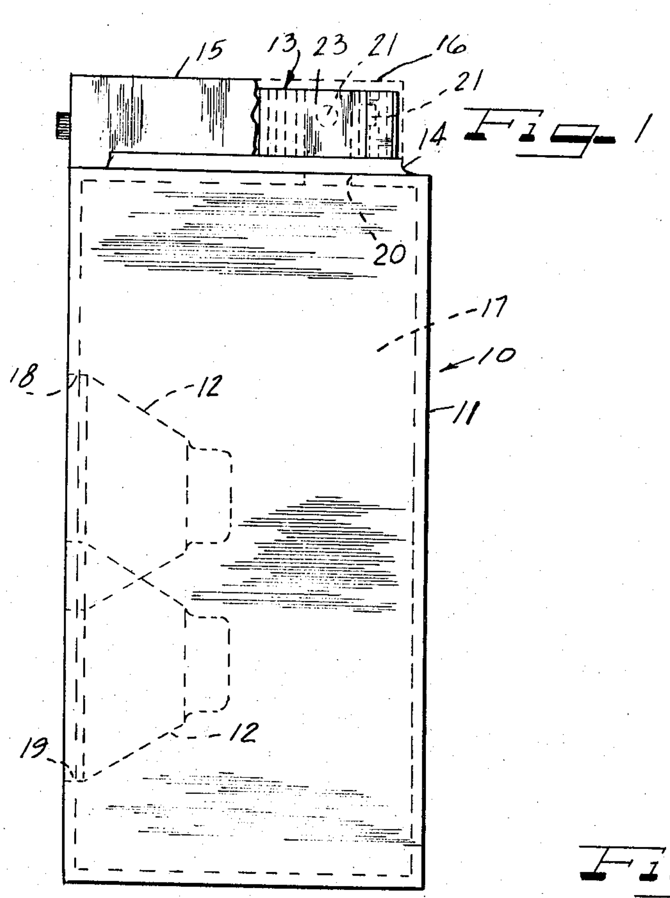
FIG. 1 is a side elevational view, partly broken away, of an audio amplifier assembly provided in accordance with the present invention.
Figure 3:
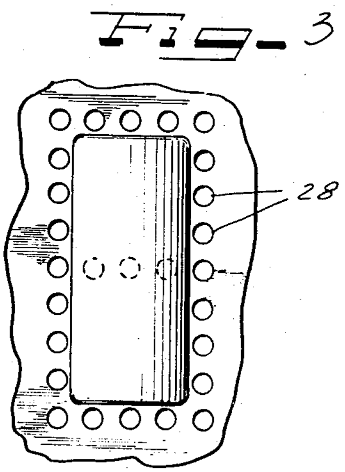
FIG. 3 is an enlarged top view of another portion of such amplifier.

AS SHOWN ON THE DRAWING:

This invention is particularly useful when embodied in an audio amplifier assembly such as illustrated in FIG. 1 and generally indicated by the numeral 10. The audio amplifier assembly 10 includes primarily a hollow cabinet 11 to which there is internally affixed a pair of speakers 12, 12, an electronic amplifier 13 having a chassis 14 and normally enclosed by a cover 15 having perforations 16 in an area that overlies those transistors identified below which are to be cooled.

In that the cabinet 11 is hollow, there is provided a cavity 17 within which the speakers 12 are disposed. The speaker cavity 17 is substantially sealed except for means that defines openings 18 and 19 at the front of the speakers 12, 12, as well as a number of openings 20, one of which is shown in FIG. 1, which constitute part of an air passage leading from the cones of the speakers 12, 12 to the transistors to be cooled.

The speakers 12 are of conventional construction and thus have cone-supporting portions that are secured to the cabinet 11 in a conventional manner. The speakers 12 are selected for their ability to handle the lower range of audio frequencies. Such frequencies are generated by a conventional type of signal source (not shown) such as an electronic guitar or an electronic base guitar, the output of which is amplified by the amplifier 13. It is well known that many musicians, particularly semi-professionals, delight in using great amounts of power, particularly for playing certain types of popular music. However, to drive the speakers 12 with a great amount of power at a low frequency requires the passing of a considerable amount of current through the power transistors of the amplifier 13, thereby causing a tendency for high heating of such transistors to take place.

A pair of such power transistors 21, 22 are mechanically secured to a pair of heat sinks 23, 24, each in direct heat-transfer relation with the heat sinks 23, 24. The heat sinks 23, 24 are mounted on the cabinet at the outer end of the air passage or passages which include the openings 20.

Although normally the transistors 21, 22 would be subject to substantial heating during high gain amplification of tone signals lying in the lower audio frequency range, when they are supported as here so as to be subjected to cooling air which passes through the air passages 20, such transistors 21, 22 are sufficiently cooled so that they can actually handle greater amounts of current than heretofore envisioned.

When the cones of the speakers 12, or either of them, are driven by the amplifier 13, the cones themselves serve as a type of air pump to cause air to move into and out of the speaker cavity 17 through the air passages 20. As the transistors 21, 22 are in alignment with the openings 20 to the air passages, it is evident that the air passage leads to the transistor to cool it for either direction of air movement.

The size of the openings 20 of the air passages is in a sense relatively small so as to provide high acoustical impedance, whereby the sound waves do not noticeably escape therethrough. Further, the use of relatively small openings in the cabinet restricts the path of air flow so as to concentrate the flow of air, particularly in the out-flowing direction so that almost a nozzle effect is created so that air moves with inertia directly toward the transistors 21, 22. The inward flow of air will of course also produce a cooling effect, but such flow tends to come from all directions of the atmospheric surroundings.

Figure 2:
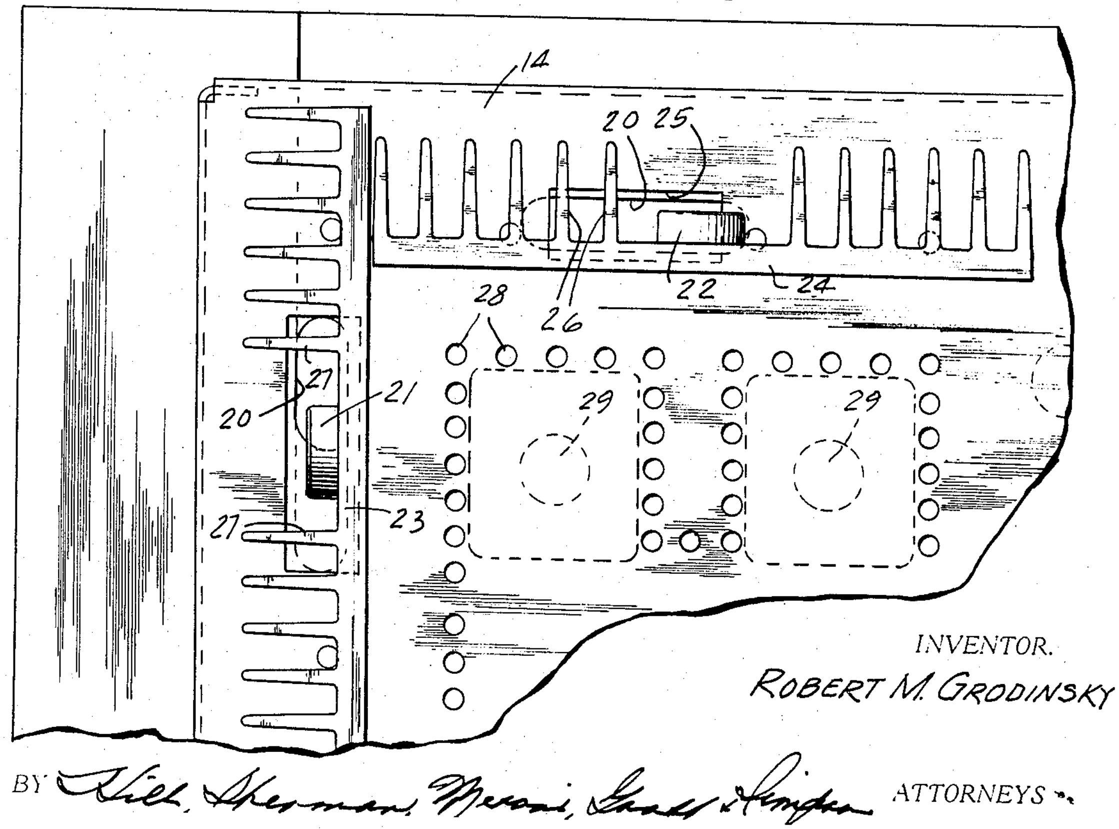
FIG. 2 is a fragmentary enlarged top view of a portion of the amplifier used in the structure of FIG. 1.

As best seen in FIG. 2, the various openings 20 are aligned with suitable openings 25 in the chassis 14. Further, each of the heat sinks 23, 24 is provided with a number of fins, here illustrated as being six on each side of each transistor. A greater number of fins has relatively little utility when employed in this configuration. The fins closest to the transistor 21, 22 of course are the hottest, and if desired, they also can be so disposed that a plurality of such fins is likewise cooled by such cooling air. Thus, two fins 26 of the heat sink 24 are so cooled and two fins 27 are so cooled in the heat sink 23.

For the transistors that are not subjected to maximum heating, other apertures 28 can be provided to encircle component boards on which such transistors 29 may be mounted. Further, the openings 28 may be employed to cool any component with speaker-driven air as required. It is not necessary to have an opening 20 through the cabinet for each of the chassis openings 28, as air can move between the cabinet and the underside of the chassis 14 to escape through one of the openings 28 at whatever point it may be located.

I have found that this invention provides an excellent means to prevent overheating of power transistors, even when relatively large amounts of current are conducted thereby as needed for high gain amplification of signals having frequencies falling in the lower audio frequency range, and thus, this construction is particularly useful for amplifier applications such as are typified by guitar and bass guitar amplifiers used at or near their audio capacity in a rock and roll band.

Although various minor modifications might be suggested by those versed in the art, it should be understood that I wish to embody within the scope of the patent warranted hereon, all such embodiments as reasonably and properly come within the scope of my contribution to the art.

I claim as my invention:

1. An air cooled assembly comprising:

a. a supporting structure;

b. speaker means for producing audible sound mounted on said supporting structure, said speaker means including a vibratory sound producing element, said vibratory sound producing element being exposed to the air adjacent thereto;

c. an electrical device capable of producing heat; and d. conduit means for providing an air flow path between said vibratory sound producing element and said device, said conduit means having opening means in a region thereof adjacent said electrical device, said conduit means being substantially imperforate between said vibratory sound producing element and said opening means whereby vibration of the vibratory sound producing element forces air to flow in said conduit means and through said opening means to cool said device.

2. An audio amplifier assembly comprising in combination:

a. a cabinet having a speaker;

b. an electronic amplifier connected to drive said speaker, and including a number of transistors, said amplifier having a cover with apertures for circulation of cooling air, said amplifier being secured to the exterior of said cabinet; and c. means on said cabinet for forcibly supplementally cooling said transistors with air driven by the movement of said speaker.

3. An audio amplifier assembly comprising in combination:

a. a cabinet defining a speaker cavity;

b. at least one speaker capable of transducing signals in the lower audio frequency range and disposed in said cavity and each having a cone-supporting portion secured to said cabinet about speaker opening means in said cabinet;

c. an electronic amplifier having a chassis disposed outside of said cabinet, said amplifier being connected to drive said speaker, said amplifier including at least one power transistor subject to heating during high-gain amplification of signals in the lower audio frequency range; and d. means defining a restricted air passage leading from said speaker cavity and directed onto said power transistor by which driven movement of said speaker forces corresponding concentrated bursts of air movement onto said power transistor.

4. An audio amplifier according to claim 3, in which said speaker cavity is substantially sealed at the rear of said speaker except for said restricted air passage means.

5. An audio amplifier according to claim 3, which includes two of said speakers.

6. An audio amplifier according to claim 3, which includes a heat sink secured to said chassis and supporting said power transistor at the outer end of said air passage means.

7. An audio amplifier according to claim 3, in which said air passage means has a size providing a high acoustic impedance.

8. An audio amplifier according to claim 7, in which said air passage means is provided by an opening leading through an outer wall of said cabinet to said transistor.

9. An audio amplifier according to claim 8, wherein said chassis has an aperture forming part of said air passage means external to said cabinet, said chassis aperture being aligned with said cabinet opening.

10. An audio amplifier according to claim 9, which includes two of said speakers, a plurality of said heat sinks being carried by said chassis and supporting a plurality of said power transistors in alignment with a plurality of said air passage means, and said speaker cabinet being substantially sealed at the rear of said speakers except for said restricted air passage means.

* * * * *